United States Patent

Pranke

[15] 3,699,465

[45] Oct. 17, 1972

[54] SELF-BALANCING PUSH PULL AMPLIFIER

[72] Inventor: John A. Pranke, Phoenix, Ariz.

[73] Assignee: Theta-Com of California, Los Angeles, Calif.

[22] Filed: June 18, 1970

[21] Appl. No.: 47,227

[52] U.S. Cl. ........................330/15, 330/25, 330/26, 330/122

[51] Int. Cl. ..............................................H03f 3/26

[58] Field of Search..........330/15, 25, 26, 28, 77, 81, 330/118, 122

[56] References Cited

UNITED STATES PATENTS

| | | | |
|---|---|---|---|
| 2,651,685 | 9/1953 | Tharp | 330/122 X |
| 3,488,603 | 1/1970 | Rogers | 330/15 |
| 2,361,198 | 10/1944 | Harmon et al. | 330/122 X |
| 3,487,324 | 12/1969 | Jones | 330/26 X |
| 2,921,266 | 1/1960 | Kiebert, Jr. | 330/81 X |

*Primary Examiner*—Roy Lake
*Assistant Examiner*—Lawrence J. Dahl
*Attorney*—Johnson, Dienner, Emrich, Verbeck & Wagner

[57] ABSTRACT

A push pull amplifier including a circuit with an input stage and an output stage having a pair of transistors connected in push pull configuration and cross coupling networks providing negative feedback between the transistors of each pair to maintain the push pull stage in a balanced operating condition, and input and output networks for the circuit including impedance matching transformers and a push pull transformer, the networks being referenced to ground through the impedance matching transformers.

8 Claims, 1 Drawing Figure

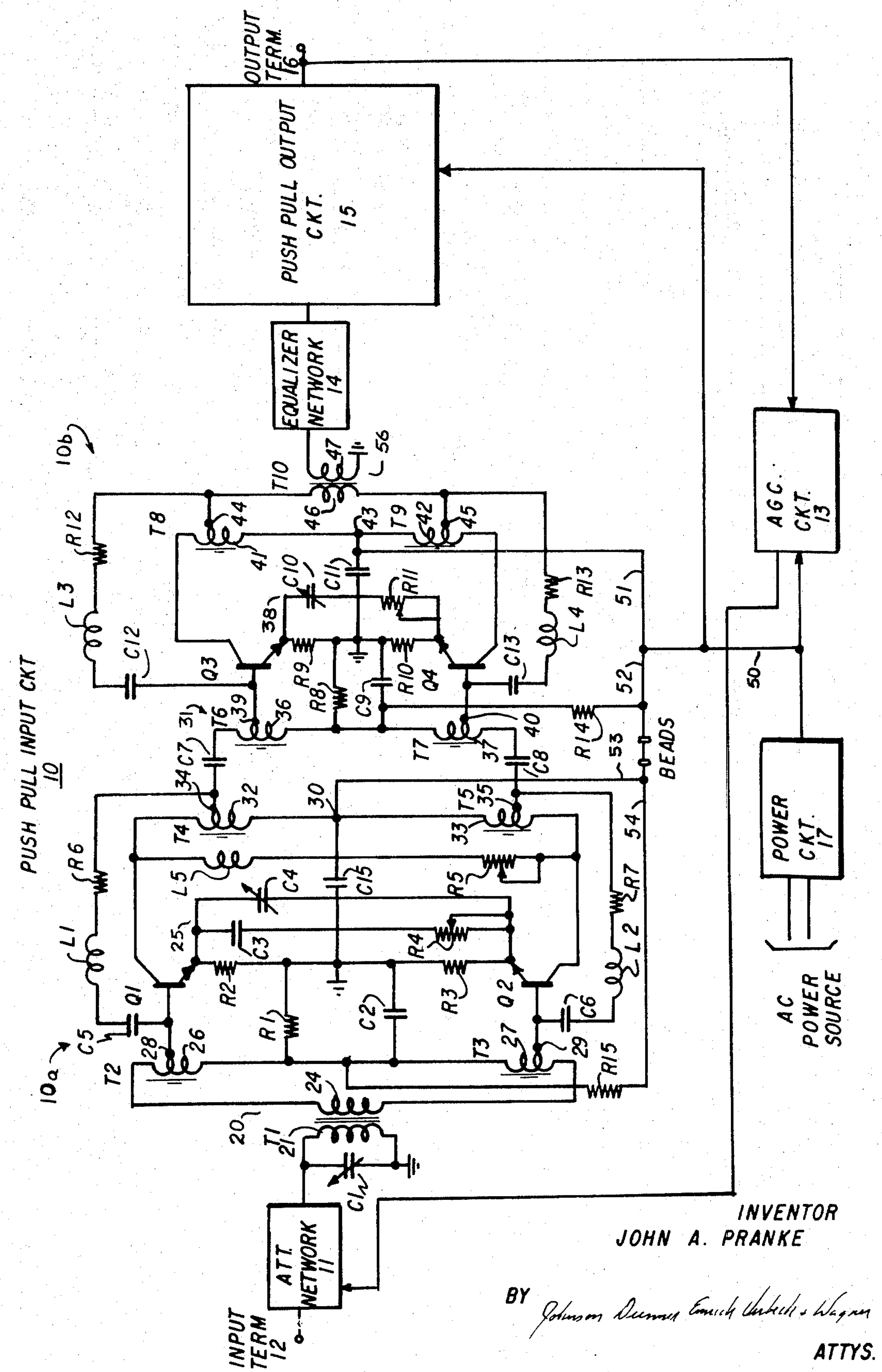
INVENTOR
JOHN A. PRANKE
BY Johnson Dienner Emrich Verbeck & Wagner
ATTYS.

SELF-BALANCING PUSH PULL AMPLIFIER

BACKGROUND OF THE INVENTION

1. Field of the Invention

This invention relates to electronic amplifier circuits, and more particularly to a push pull type amplifier having self-balancing characteristics.

2. Description of the Prior Art

Signal amplifiers frequently employ push pull type amplifier stages to minimize signal distortion caused by the nonlinear operating characteristics of active devices of the amplifier.

Generally some unbalance of the amplifier circuit may occur due to differences in the operating characteristics of the active devices or in the values of passive components used in the mirror image circuits which comprise each push pull stage.

To compensate for the unbalance caused by elements of the amplifier, a manual balance control has been provided in prior art push pull amplifiers which permits relative adjustment of the DC bias levels of the two circuits which comprise each push pull stage.

Another consideration of push pull amplifiers is the need for a phase splitting network to provide the out phase signals for the push pull sections of the amplifier, and a network for combining the out of phase signals provided at the output of the amplifier.

The input and output networks generally comprise center tapped transformers with the center tap being connected to ground to provide a reference point for the networks. Such transformers introduce losses and may provide further unbalance for the amplifier.

SUMMARY OF THE INVENTION

The present invention provides a transistorized push pull amplifier using common emitter push pull stages in which cross coupling networks provide negative feedback between the emitters of transistors which comprise a push pull stage. Accordingly, compensation is automatically provided for any unbalance in the circuits which could otherwise result in a signal in one half of the push pull stage being greater than the signal in the other half of the push pull stage. Thus, the amplifier is self-balancing and no manual balance controls are required.

Further balance for the amplifier is provided through the use of impedance matching transformers in addition to the push pull transformers at the input and output of the amplifier. The push pull transformers are not center tapped. Instead, the input circuit and the output circuit are referenced to ground through the impedance matching transformers. In this way, the amplifier input circuit provides balanced push-pull signals for the amplifier with minimum losses.

In one embodiment, an amplifier provided by the present invention comprises a two stage push pull input circuit and a two stage push pull output circuit each stage of which includes the above-mentioned self-balancing arrangement. In addition, both the input circuit and the output circuit include the novel transformer network having a push pull input transformer and a push pull output transformer referenced to ground through separate impedance matching transformers.

Accordingly, in this amplifier, second order distortions are not a limitation for high frequency applications. Thus, for example, the amplifier is suitable for use over the frequency range of approximately 50 MHz to 270 MHz, which comprises the VHF and the UHF frequency bands.

Moreover, the amplifier stages include gain adjust networks which permit the amplifier to exhibit a substantially flat response characteristic over this frequency range.

DETAILED DESCRIPTION OF THE PREFERRED EMBODIMENT

The push pull amplifier provided by the present invention is set forth in the single FIGURE which comprises the only drawing of the disclosure.

In an exemplary illustration, the amplifier is used as a main line or trunk line amplifier in a cable television system. As such, the amplifier is capable of providing amplification of signals over a band of frequencies ranging from 50 MHz to 270 MHz, the VHF and UHF frequency bands.

In these systems multiple channel operation is provided, and consequently, the suppression of second harmonics is necessary to obtain satisfactory operation of the system.

The amplifier provided by the present invention reduces second order distortions so that they are not a limitation in expanded channel operation.

Referring to the block diagram of the push pull amplifier shown in the drawing, the amplifier has a push pull input circuit 10 coupled through an r.f. attenuation network 11 to an input terminal 12 of the amplifier. The output of the push pull input circuit 10 is coupled through an equalizer network 14 to a push pull output circuit 15 which is similar to the push pull input circuit 10.

The output of the push pull output circuit 15 is extended to an output terminal 16 of the amplifier.

An automatic gain control circuit 13 is connected to the output terminal for deriving a signal for controlling the impedance characteristic of the attenuation network 11 such that a change in the input signal of up to 8 db will effect a corresponding change in the output signal of less than 0.5 db.

A power circuit 17 derives a DC bias potential for the push pull circuits 10, 15 and the automatic gain control circuit 13 from an AC power source.

Referring to the schematic circuit diagram of the push pull input circuit 10 shown in the drawing, the push pull input circuit 10 comprises an input stage 10a including transistors Q1 and Q2 and an output stage 10b including transistors Q3 and Q4 coupled to the input stage through a coupling network 31 including impedance matching transformers T4–T7, which may be autotransformers.

Signals input to the amplifier over input terminal 12 are coupled through the attenuating network 11 to the primary winding 21 of an input network transformer T1.

One end of the winding 21 is connected to the output of the attenuator network 11 and the other end of winding 21 is connected to ground. A variable capacitor C1 is connected in parallel with the primary winding 21 of transformer T1.

It is pointed out that transformer T1 of phase splitting input network 20 is not center tapped, and the input network 20 is referenced to ground through a pair of impedance matching transformers T2–T3 which may be autotransformers. Thus, one end of the secondary winding 24 of transformer T1 is connected to ground through a winding 26 of transformer T2 and the parallel combination of a resistor R1 and capacitor C2. The other end of the secondary winding 24 is connected to ground through a winding 27 of transformer T3 and the parallel combination of resistor R1 and capacitor C2.

Transformers T2 and T3 also provide an impedance match between the input stage 10*a* and the impedance of the signal source connected to the amplifier input terminal 12 as seen through attenuator network 11.

Transformers T2 and T3 have taps 28 and 29, respectively, for providing out-of-phase signals for the two circuits (comprising transistors Q1 and Q2) which form the input stage 10*a* of the push pull input circuit 10. The base of transistor Q1 of the input stage 10*a* is connected to tap 28 of transformer T2 and the base of transistor Q2 of the input stage 10*a* is connected to tap 29 of transformer T3.

The bases of transistors Q1 and Q2 are also connected through a portion of the windings 26 and 27, respectively, resistor R15 and conductors 54, 52 and 50 to the output of the power circuit 17.

In operation, signals provided at the amplifier input terminal 12 are coupled through the attenuation network 11 to the primary winding 21 of the input transformer T1. The input signals are coupled to the secondary winding 24 which has one end referenced to ground through winding 26 of transformer T2 and its other end referenced to ground through winding 27 of transformer T3.

Accordingly, signals provided across winding 26 and coupled to transistor Q1 will be of one polarity and the signals provided across winding 27 and coupled to transistor Q2 will be 180° out of phase with the signals appearing across winding 26.

The emitters of transistors Q1 and Q2 of the input stage 10*a* of the push pull input circuit 10 are connected to ground through resistors R2 and R3, respectively.

Therefore, the out of phase signals provided by the input network 20 will appear between the base and the emitter leads of transistors Q1 and Q2, respectively, and amplified out of phase signals will appear between the collector and emitter leads of transistors Q1 and Q2.

The emitters of transistors Q1 and Q2 are also interconnected by a negative feedback network 25 which includes a capacitor C3 and a variable resistor R4 connected in series, and a variable capacitor C4 which is connected in parallel with the series combination of capacitor C3 and resistor R4.

The emitter-emitter feedback network 25 provides negative feedback from one side of the amplifier stage to the other enhancing the stability of the amplifier and contributing to the balance of the amplifier.

In addition to balance control, the network 25 also permits adjustment of the gain versus frequency characteristic of the amplifier. The combination of capacitor C3 and resistor R4 provide low frequency response control, and capacitor C4 provides high frequency response control.

The collectors of transistors Q1 and Q2 are coupled together through a network including an inductor L5 and a variable resistor R5. This network provides negative feedback between the collectors of transistors Q1 and Q2 reducing the gain at frequencies near 50 MHz in the present example, so that the amplifier gain remains substantially constant over the frequency range of application, that is, 50 MHz to 270 MHz.

A shunt feedback network including resistor R6, inductor L1 and capacitor C5 is connected from a tap 34 of interstage coupling transformer T4 to the base of transistor Q1. A similar shunt feedback network including a resistor R7, an inductor L2 and a capacitor C6 is connected from a tap 35 of interstage coupling transformer T5 to the base of transistor Q2. These shunt feedback networks provide the basic gain versus frequency characteristic for the amplifier stage.

The collectors of transistors Q1 and Q2 are coupled to a point 30 through the windings 32 and 33 of transformers T4 and T5, respectively, and over conductors 53, 52 and 50 are connected to the output of the power supply 17. Point 30 is also connected to ground through a capacitor C15.

The out of phase signals provided at the collectors of transistors Q1 and Q2 will appear across windings 32 and 35, respectively. Under normal operating conditions the signals will be equal in amplitude and opposite in phase.

Assuming, on the other hand, that an unbalance condition occurs, then, for example, the amplitude of the signal (assumed to be positive) appearing across winding 32 may be greater than the signal (which will be negative) appearing across winding 33.

When the signal appearing across winding 32 increases in the positive direction, the emitter of transistor Q1 will become more positive relative to the emitter of transistor Q2. Consequently, through the emitter-emitter coupling provided by the feedback network 25, the emitter of transistor Q2 will become more positive so that in effect, the amplitude of the negative signal across winding 33 will increase, correspondingly making the emitter of transistor Q1 more negative and thereby compensating for the original increase in the output signal provided transistor Q1.

Transformers T4 and T5 together with transformers T6 and T7 couple the input stage 10*a* to the output stage 10*b* of the push pull input circuit 10 and provide an impedance match between the two stages.

The winding 36 of transformer T6 has one end connected through capacitor C7 to the tap 34 of transformer T4, and its other end connected through a resistor R8 to ground. A capacitor C9 is connected in parallel with resistor R8.

The winding 37 of transformer T7 has one end connected through capacitor C8 to the tap 35 of transformers T5 and its other end connected through resistor R8 and capacitor C9 to ground.

The base of output stage transistor Q3 is connected to the tap 39 of transformer T6, and the base of output stage transistor Q4 is connected to the tap 40 of transformer T7.

The bases of transistors Q3 and Q4 are also connected through portions of windings 36 and 37, respectively, resistor R14, and conductors 52 and 50 to the output of the power supply circuit 17.

The amplified signals provided at the outputs of transistors Q1 and Q2 are coupled over the interstage coupling network 31 to the bases of transistors Q3 and Q4, respectively.

The emitter of transistor Q3 is connected to ground through a resistor R9, and the emitter of transistor Q4 is connected to ground through a resistor R10. Moreover, the emitters of transistors Q3 and Q4 are interconnected through a series feedback network 38 including a variable capacitor C10 and a variable resistor R11. The network 38 comprising capacitor C10 and resistor R11 provides negative feedback between the emitters transistors Q3 and Q4, to provide the automatic balancing function for the output stage 10*b* in a manner similar to that described with reference to the feedback network 25 of the input stage 10*a*. The network 38 also permits adjustment of the high frequency gain for the output stage 10*b* of the push pull input circuit 10.

The out of phase signals, amplified by the output stage 10*b*, transistors Q3 and Q4 will appear across windings 41 and 42, respectively of impedance matching transformers T8 and T9, which may be autotransformers, which together with transformer T10 comprise the output network 56 of the push pull input circuit 10.

One end of winding 41 is connected to the collector of transistor Q3 and the other end of winding 41 is coupled to ground through a capacitor C11.

In a similar manner, one end of winding 42 is connected to the collector of transistor Q4 and the other end of winding 42 is coupled to ground through the capacitor C11.

The ends of the windings 41 and 42 which are coupled to ground are connected together at point 43 and over conductors 51 and 50 are connected to the output of the power supply circuit 17.

A shunt negative feedback network, including a resistor R12, an inductor L3 and a capacitor C12 is connected from a tap 44 of transformer T8 to the base of transistor Q3 to provide collector-to-base feedback for transistor Q3. A similar negative network including a resistor R13, an inductor L4 and a capacitor C13 is connected between a tap 45 of transformer T9 to provide collector-to-base feedback for transistor Q4. These feedback networks determine the gain versus frequency characteristic for the amplifier stage 10*b*.

The transformer T10 has one end of its primary winding 46 connected to the tap 44 of transformer T8 and its other end connected to the tap 45 of transformer T9. The secondary winding 47 of output transformer T10 has one end connected to the equalizer circuit 14, and its other end connected to ground.

The output network 56 is referenced to ground through the impedance matching transformers T8 and T9 in a manner similar to the referencing of the input network 20. The output network 56 serves to recombine the out-of-phase signals provided at the outputs of the two circuits (comprising transistors Q3 and Q4) which form the output stage 10*b* of the push pull input circuit 10.

The resulting signals are coupled over output transformer T10 through the equalizer network to the push pull output circuit 15. The push pull output circuit 15 is similar to the push pull input circuit 10 and comprises a push pull input stage and a push pull output stage, and an input network, an output network and an interstage coupling network which are similar to those illustrated in the schematic circuit diagram of the push pull input circuit 10.

Accordingly, the mode of operation of the push pull output circuit 15 is substantially identical with the operation of the input circuit 10 and will not be described in detail.

The signals amplified by the output circuit 15 are passed to the amplifier output terminal 16. Such output signals are monitored by the automatic gain control circuit 13, which is responsive to variations in the output signal level to provide signals for controlling the impedance characteristic of the attenuation network 11 at the input of the amplifier. Automatic gain control circuits for performing this function are known in the art.

I claim:

1. A self-balancing push pull amplifier comprising a push pull stage including first and second transistors connected in push pull relationship, each of said transistors having an input electrode, an output electrode and a reference electrode, input means connected between the input electrodes of said first and second transistors for deriving first input signals for said first transistor and second input signals of opposite phase for said second transistor from signals input to said amplifier, output means connected between the output electrodes of said first and second transistors for combining first amplified signals provided by said first transistor and second amplified signals provided by said second transistor to provide output signals for said push pull stage, means for providing a fixed DC bias potential for the reference electrodes of said first and second transistors and an AC signal coupling network connected between the reference electrodes of said first and second transistors for coupling negative feedback signals from the reference electrode of one of said transistors to the reference electrode of the other one of said transistors whenever the amplitude of the amplified signals provided by said one transistor is greater than the amplitude of the amplified signals provided by said other transistor to thereby maintain the amplitude of said first amplified signals substantially the same as the amplitude of said second amplified signals.

2. A self-balancing push pull amplifier as set forth in claim 1 in which said input means includes a first transformer, a second transformer, and an input transformer for coupling said amplifier input signals to said first and second transformers, said input transformer having a winding with one end connected to a point of reference potential through a winding of said first transformer and another end connected to the point of reference potential through a winding of said second transformer whereby first input signals coupled to said first transformer are opposite in phase with second input signals coupled to said second transformer, and signal means connected between said first and second transformers and the input electrodes of said first and second transistors for extending the first input signals to said first transistor and the second input signals to said second transistor.

3. A self-balancing push pull amplifier as set forth in claim 2 in which said signal means includes a push pull input stage including third and fourth transistors connected in push pull relationship for amplifying said first and said second input signals to provide first and second amplified input signals, said third and fourth transistors each having an input electrode, an output electrode and a reference electrode, the input electrode of said third transistor being connected to said first transformer, the input electrode of said fourth transistor being connected to said second transformer, means for coupling said first amplified input signals to the input electrode of said first transistor, means for coupling said second amplified input signals to the input electrode of said second transistor, and a further AC signal coupling network connected between the reference electrodes of said third and said fourth transistors for coupling negative feedback signals from the reference electrode of one of said transistors to the reference electrode of the other one of said transistors whenever the amplitude of the amplified input signals provided by said one transistor is greater than the amplitude of the amplified input signals provided by said other transistor to thereby maintain the amplitude of said first amplified input signals substantially the same as the amplitude of said second amplified input signals.

4. A self-balancing push pull amplifier as set forth in claim 1 in which said AC signal coupling network includes means for adjusting the frequency response of said push pull stage.

5. A self balancing push pull amplifier as set forth in claim 1 in which said output means includes an output transformer, a first transformer for coupling said first amplified signals to said output transformer and a second transformer for coupling said second amplified signals to said output transformer, said output transformer having a winding with one end connected to a point of reference potential through a winding of said first transformer and another end connected to the point of reference potential through a winding of said second transformer whereby said first amplified signals and said second amplified signals are combined across said output transformer winding.

6. A push pull amplifier comprising, a push pull circuit including first and second transistors connected in push pull relationship, a first transformer having a first winding and means for coupling input signals derived from said first winding to said first transistor, a second transformer having a second winding and means for coupling input signals derived from said second winding to said second transistor, a phase splitting transformer including an input circuit over which signals are received and an output winding connected in series with said first and second windings, and means for connecting a point of reference potential to the junction of said first and second windings whereby the input signals coupled to said first transistor are opposite in phase with the input signals coupled to said second transistor.

7. A push pull amplifier as set forth in claim 6 and further including an output transformer having at least one winding, a third transformer having a third winding and means for coupling first amplified signals derived from said third winding to said output transformer winding, a fourth transformer having a fourth winding and means for coupling second amplified signals derived from said fourth winding to said output transformer winding, said third and fourth windings being connected in series across the output of said push pull circuit and means for connecting said point of reference potential to the junction of said third and fourth windings whereby the first amplified signals coupled to said output transformer winding are in phase with the second amplified signals coupled to said output transformer winding.

8. A self-balancing push pull amplifier comprising a push pull stage including first and second transistors connected in push pull relationship, said first and second transistors each having an input electrode, an output electrode and a control electrode, input means including a first transformer connected to the input electrode of said first transistor, a second transformer connected to the input electrode of said second transistor and an input transformer for coupling signals input to said amplifier to said first and second transformers to provide oppositely phased input signals for said first and said second transistors, output means connected between the output electrode of said first transistor and the output electrode of said second transistor for combining first amplified signals provided by said first transistor and second amplified signals provided by said second transistor, means for providing a fixed DC potential for the reference electrodes of said first and second transistors, a first AC signal coupling network connected between the reference electrode of said first transistor and the reference electrode of said second transistor to provide negative feedback signals for maintaining the amplitude of the first amplified signals substantially the same as the amplitude of the second amplified signals, and a second AC signal coupling network connected between the output electrode of said first transistor and the output electrode of said second transistor for coupling negative feedback signals from the output electrode of said first transistor to the output electrode of said second transistor for maintaining the gain of said push pull amplifier substantially constant over a predetermined frequency range.

* * * * *